United States Patent
Specht et al.

(10) Patent No.: US 9,090,975 B2
(45) Date of Patent: Jul. 28, 2015

(54) STRUCTURING THREE-DIMENSIONAL COMPONENTS WITH NON-DIFFUSING NOBLE OR SPECIAL METALS AND THEIR ALLOYS, WITH USE BEING MADE OF SPUTTER TECHNOLOGY

(75) Inventors: Heiko Specht, Hanau (DE); Andreas Reisinger, Alezenau (DE); Ulrich Hausch, Frankfurt (DE); Frank Krueger, Nidderau (DE); Jens Troetzschel, Neuwiedermus (DE)

(73) Assignee: Heraeus Precious Metals GmbH & Co. KG, Hanau (DE)

( * ) Notice: Subject to any disclaimer, the term of this patent is extended or adjusted under 35 U.S.C. 154(b) by 1040 days.

(21) Appl. No.: 13/164,305

(22) Filed: Jun. 20, 2011

(65) Prior Publication Data

US 2011/0308957 A1 Dec. 22, 2011

(30) Foreign Application Priority Data

Jun. 21, 2010 (DE) .......................... 10 2010 024 498

(51) Int. Cl.
  *C23C 28/02* (2006.01)
  *B81C 1/00* (2006.01)
(52) U.S. Cl.
  CPC ............ *C23C 28/023* (2013.01); *B81C 1/00619* (2013.01); *B81C 2201/0107* (2013.01); *B81C 2201/0181* (2013.01)
(58) Field of Classification Search
  None
  See application file for complete search history.

(56) References Cited

U.S. PATENT DOCUMENTS

| | | | |
|---|---|---|---|
| 2001/0039449 A1* | 11/2001 | Johnson et al. | ............... 623/1.19 |
| 2007/0158200 A1 | 7/2007 | Cohen et al. | |
| 2009/0142493 A1 | 6/2009 | Zhang et al. | |

FOREIGN PATENT DOCUMENTS

WO  2007093423  8/2007

OTHER PUBLICATIONS

Wood et al, Indentation characteristics of superelastic nickel—titanium wires and a preliminary study of copper-bonded joints between them, from Smart Structures and Materials 2004: Active Materials: Behavior and Mechanics, ed. By D. Lagoudas, Proceedings of SPIE vol. 5387, 2004, no month available.*

* cited by examiner

*Primary Examiner* — Harry D Wilkins, III
(74) *Attorney, Agent, or Firm* — Dicke, Billig & Czaja, PLLC

(57) ABSTRACT

One aspect is a method for the production of a three-dimensional structure of successive layers producing a multitude of successive layers wherein, with the exception of a first layer, each of the successive layers is arranged on a preceding layer. Each of the successive layers includes at least two materials wherein one material is a sacrificial material and one material is a structure material. Each of the successive layers defines a successive cross-section through the three-dimensional structure. Producing each of the layers includes depositing the sacrificial material by means of an electrochemical process and depositing the structure material by means of physical gas phase deposition. After a multitude of successive layers has been produced, the three-dimensional structure is uncovered by removing at least a part of the sacrificial material. The sacrificial material is at least one of a group consisting of nickel, silver, palladium, and gold.

17 Claims, 5 Drawing Sheets

STRUCTURING THREE-DIMENSIONAL COMPONENTS WITH NON-DIFFUSING NOBLE OR SPECIAL METALS AND THEIR ALLOYS, WITH USE BEING MADE OF SPUTTER TECHNOLOGY

CROSS-REFERENCE TO RELATED APPLICATIONS

This Utility Patent Application claims priority to German Patent Application No. DE 10 2010 024 498.8, filed on Jun. 21, 2010, which is incorporated herein by reference. This Patent Application is also related to Utility patent application Ser. No. 13/164,313, filed on Jun. 20, 2011, entitled "STRUCTURING THREE-DIMENSIONAL COMPONENTS WITH A DIFFUSION BARRIER MADE OF NOBLE OR SPECIAL METALS AND THEIR ALLOYS, WITH USE BEING MADE OF SPUTTER TECHNOLOGY", which is incorporated herein by reference.

BACKGROUND

US 2007/0158200 A1 describes what is called an "EFAB" process by Microfabrica. Within the scope of this method, a multitude of layers is sequentially applied onto a substrate. Therein, each of the layers preferably contains at least one sacrificial material and one structure material. This technology has advantage some situations in that almost any three-dimensional structures can be produced. Since the structure is generated by means of galvanic metal deposition, however, the choice of metals and alloys is limited. In particular, metals that are used in medical engineering, such as tantalum or platinum, cannot be deposited or can only be deposited with thin layer thicknesses by means of electrochemical processes. As an alternative, it is possible to apply compact layers of the structure material by sputtering. This, however, has turned out to be disadvantageous in that, while the metals are being deposited by physical gas phase depositions—such as sputtering—parts of the sacrificial material penetrate into the structure material by diffusion. In structures that are used in medical engineering, however, such contaminants cannot be accepted because, often, use is made of sacrificial materials which are not biocompatible.

For these and other reasons there is a need for the present invention.

SUMMARY

One aspect relates to a method for the production of a three-dimensional structure of successive layers, including producing a multitude of successive layers wherein, with the exception of a first layer, each of the successive layers is arranged on a preceding layer. Each of the successive layers includes at least two materials wherein one material is a sacrificial material and one material is a structure material. Each of the successive layers defines a successive cross-section through the three-dimensional structure. It includes producing each of the layers by depositing the sacrificial material by means of an electrochemical process, and depositing the structure material by means of physical gas phase deposition, wherein the structure material is a metal. After a multitude of successive layers has been produced, the three-dimensional structure is uncovered by removing at least a part of the sacrificial material. The sacrificial material is at least one of a group consisting of nickel, silver, palladium, and gold.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

Further advantages, features and details of the invention result from the subordinate claims and the following description which describes in detail a plurality of exemplary embodiments of the invention with reference being made to the drawings. Therein, the features mentioned in the claims and the description can each be essential for the invention either separately or in any combination desired. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment relates to a method for the manufacture of a three-dimensional structure of successive layers. The method includes producing a multitude of successive layers wherein, with the exception of a first layer, each of the successive layers is arranged on a preceding layer. Each of the successive layers includes at least two materials wherein one material is a sacrificial material and one material is a structure material. Each of the successive layers defines a successive cross-section through the three-dimensional structure. Each of the layers is produced with the following steps:

depositing the sacrificial material by means of an electrochemical process, and depositing the structure material by means of physical gas phase deposition, wherein the structure material is a metal.

After a multitude of successive layers has been produced, the three-dimensional structure is uncovered by removing at least a part of the sacrificial material.

One embodiment creates a method for the production of a three-dimensional structure of successive layers, which obviates the drawbacks discussed above, and in one embodiment, providing a method which prevents contamination of the structure material.

In one embodiment, the method is characterized in that the sacrificial material is at least one of a group consisting of nickel, silver, palladium, and gold.

In one embodiment of the method, the materials that are, in general, used as sacrificial material, such as copper, are no longer used as sacrificial material but, instead, at least one of the materials of the group consisting of nickel, silver, palladium, and gold. Surprisingly, comprehensive measurements have illustrated that sacrificial materials from the four metals mentioned do not diffuse into the structure material even if the latter is deposited by means of physical gas phase deposition, such as gas flow sputtering. Apparently, the individual atoms of the sacrificial materials mentioned are so firmly arranged in their atomic lattices that none of the metals of the sacrificial material are pulled out of their lattice and diffuse into the structure material, even if the thermally heated atoms of the structure material are applied by means of a physical gas phase deposition process.

The method according to one embodiment, therefore, also allows producing three-dimensional structures for medical engineering. Known sacrificial materials, such as copper, result in a contamination of the structure material to such a high degree that they cannot be used without hesitation in medicine any longer, to be implanted in a human body. The step of uncovering the three-dimensional structure—a step which will still be described in more detail—that follows the production of a multitude of successive layers and includes removing at least a part of the sacrificial material, in one embodiment the complete sacrificial material, therefore results in a three-dimensional structure, which in one embodiment, consists of a biocompatible material.

Therein, complete removal of the sacrificial material can be achieved without any problem, with the result that no residues whatsoever remain in the three-dimensional structure. If a small amount of residues remain within the three-dimensional structure contrary to expectations, the concentration of said residues, however, is so low that there will not be any complications, not even if the three-dimensional structure is implanted in a human body, such as, for example, in case of a cardiac pacemaker electrode.

In an executive form, the sacrificial material does not contain elements of the group consisting of nickel, silver, palladium, and gold only. Rather, it is provided according to one embodiment that the sacrificial material consists at least of one of the group consisting of nickel, silver, palladium, and gold. It is also conceivable that the sacrificial material consists of nickel or silver or palladium and gold; this has even been tested successfully. As a matter of course, trace elements that cannot be removed are always a part of the sacrificial material even if the latter is to consist of a single metal. However, it is provided according to one embodiment that, in this case, the purity of the metal used, that is, nickel or silver or palladium or gold, is better than 99.5% by weight, in one embodiment more preferably better than 99.95% by weight, in one embodiment most preferably better than 99.995% by weight.

Within the scope of one embodiment, diffusion means penetration of parts of the sacrificial material into the structure material down to a depth of more than 200 nm, in one embodiment preferably more than 100 nm. Within the scope of the method according to one embodiment, any diffusion of the sacrificial material into the structure material is completely prevented.

It is expressly pointed out that the order of steps I and II can be exchanged. The method according to one embodiment includes both a sequence where the sacrificial material (step I) is applied first and the structure material (step II) is applied thereafter and a sequence where the structure material (step II) is applied first and the sacrificial material (step I) is applied thereafter.

In the "EFAB" process by Microfabrica described in US 2007/0158200 A1, a functional layer from the structure material is, initially, electroplated selectively onto a conductive substrate in the presence of an electrochemical bath. The selectivity can be achieved by a method that is called "instant masking" where a mask is in contact with the substrate while the functional layer is being applied. After the mask has been removed, the sacrificial layer—from the sacrificial material—is electroplated across the entire area of the functional layer. The final process step consists of a planarization where any superfluously deposited metal is removed from the functional and sacrificial layers. This process sequence is cyclically repeated until the finished part has been structured. The last step consists of removing the sacrificial layer by wet-chemical etching. The method steps used according to one embodiment, can differ from the "EFAB" process described in US 2007/0158200 A1. With regard to the corresponding method steps, reference shall, nevertheless, be made to application US 2007/0158200 A1, the content of which is herewith incorporated into this application.

The term "three-dimensional structure" refers to a spatial object, such as a cardiac pacemaker electrode, which can be produced by means of the method according to one embodiment. Therein, the three-dimensional structure consists of a multitude of layers of the structure material, which are applied onto each other. In this respect, reference is also made to the feature "three-dimensional structure" as defined in patent application US 2007/0158200 A1, the content of which is herewith incorporated into this patent application.

The term "structure material" describes one or more materials which are deposited within the scope of producing the three-dimensional structure. This material is intended to form the three-dimensional structure after the sacrificial material has been removed. In this respect, reference is also made to the feature "structure material" as defined in patent application US 2007/0158200 A1, the content of which is herewith incorporated into this patent application.

The term "sacrificial material" refers to one or more materials which are applied while the multitude of successive layers is being produced. Therein, the sacrificial material is chosen to be removed again after producing the multitude of successive layers has been completed. In this respect, reference is also made to the feature "sacrificial material" as defined in patent application US 2007/0158200 A1, the content of which is herewith incorporated into this patent application.

One embodiment variant is characterized in that the structure material include(s) a noble and/or platinum and/or refractory metal. One embodiment allows producing three-dimensional structures for medical engineering. In general, the materials described include a good biocompatibility and can, therefore, be used in medical engineering. Since what is claimed according to one embodiment is that depositing the structure material is achieved by means of physical gas phase deposition, the method according to one embodiment also allows producing macroscopically larger medical engineering elements without posing the risk that parts of the sacrificial material diffuse into the structure material.

Furthermore, it has turned out to be advantageous in one embodiment if the structure material includes at least one of the following metals, and in one embodiment includes at least 50% by weight of one of the following metals, in one embodiment most preferably consists of one of the following metals: platinum, platinum-iridium, tantalum, tantalum-tungsten, tantalum-niobium-tungsten, nickel, nickel-tantalum, nickel-tungsten, niobium and niobium-zirconium. An alternative executive form of this embodiment variant is characterized in that the structure material consists of at least 50% by weight, in one embodiment more preferably of at least 80% by weight, of one of the metals mentioned. For example, it can also be advantageous in one embodiment if the structure material consists of one metal, for example, platinum.

Depending on the metal that has been selected as sacrificial material, said metal completely prevents the sacrificial material from penetrating to the structure material that is arranged thereon in space. This behaviour could be successfully proven for a material combination consisting of platinum as structure material and silver as sacrificial material.

A further embodiment variant is characterized in that, by means of the physical gas phase deposition, at least two metals are deposited at the same time, wherein the two metals form an alloy as structure material. In this executive form, the structure material does not consist of a single metal. Rather, two metals are deposited at the same time, for example, by a sputtering method. As a consequence, a structure material which consists of at least two metals is formed in the successive layers. The compound thus generated forms an alloy. Within the scope of the physical gas phase deposition, the two metals to be applied are transferred to their gas phase and condensate in the layers of the three-dimensional structure. Within the scope of the gas phase, the two metals can be mixed with each other such that an extremely homogeneous alloy can be implemented for the structure material. For example, it was unproblematic in one embodiment to deposit tantalum-niobium-tungsten alloys which then resulted in three-dimensional structures for medical devices which consisted of a biocompatible tantalum-niobium-tungsten alloy. This method step can be further optimized by moving the successive layers within the scope of depositing in steps I and/or II and/or III, in order to achieve a homogeneous composition of the structure material. Here, the term "move" is to be interpreted as moving the layers applied onto or having already formed on the substrate in at least one of the three physical planes and/or in a rotary manner in relation to the sources of the gaseous metal(s) within the scope of the physical gas phase deposition or inside the bath of the electrochemical process. This ensures that, even if the metals are generated and/or distributed in the gas phase or the electrochemical bath in a non-uniform manner, the successive layers thus formed include a uniform composition. Therein, the term "uniform" is to be interpreted such that any potential deviations in the thickness and/or an alloy composition, as viewed across the area of a layer, are less than 5%, in one embodiment preferably less than 3%, of the aimed-at alloy composition and/or layer thickness.

A further embodiment variant is characterized in that, during the physical gas phase deposition, use is made of gas flow sputtering and/or magnetron sputtering. The hollow cathode used in gas flow sputtering can be a metal target which is removed in a large-scale manner by a hollow cathode discharge. A strong gas current, for example, argon, transports the dusted-off material in atomic form out of the hollow cathode to the surface of the substrate where said material is deposited as a layer at a high rate. This process management allows successfully coating components with complex geometries and, by supplying secondary gases, depositing, for example, oxidic and/or nitridic layers in a reactive manner. When magnetron sputtering is used, an additional magnetic field is arranged behind a cathode plate. Due to the superposition of electric field and magnetic field, the charge carriers no longer move in parallel to the electric field lines but are deflected onto a spiral path. As a result, their path is extended and the number of impacts per electron increases. The effectively higher ionization capacity of the electrons results in an increase in the number of noble gas ions and, therefore, also in the sputtering rate.

Gas flow sputtering is to an advantage in one embodiment in that the reactive gas cannot advance to the target surface. As a result, there are no plasma instabilities and no reduced rates, and complex measuring and controlling equipment is not necessary. Therefore, very high coating rates of up to 100 µm/h can be reached, in one embodiment for oxide layers. Since a magnetic field is not required, the target is removed uniformly and the power level that can be reached during work is very high, this being of benefit to a high coating rate. For this reason, gas flow sputtering is also suited for layer thicknesses above a few micrometers. What is more, the target is utilized very well, and it is also possible to implement coatings with magnetically soft targets without any problems. Due to the high process pressure, the high-energy plasma particles lose the major part of their energy on their way to the substrate. This results in low-stress layers and it is also possible to coat sensitive substrates. On the other hand, the high number of ions can be efficiently re-accelerated by a substrate prestress; this results in very compact layers. In case of an extended flight path, the atoms first form into clusters and then into nanoparticles. In this manner, it is also possible to generate nanoporous layers in a defined manner.

A further embodiment variant is characterized in that step (B) consists of removing the sacrificial layer by wet-chemical etching. For example, the sacrificial materials silver (Ag) and palladium (Pd) can be dissolved selectively with nitric acid (HNO3), in one embodiment preferably 65% nitric acid. The sacrificial material gold (Au) can be dissolved selectively with KI/I₂ solutions or NaCN/H2O2 solutions or with commercially available products, such as, for example, "Degussa 645—gold stripping solution." The sacrificial material nickel (Ni) can be etched selectively and mildly by means of FeCl3, in one embodiment preferably as a 10% solution. In tests, it was possible to remove the aforementioned sacrificial metals within a few hours to 2 days without the structure being attacked.

A further embodiment variant is characterized in that the layer thickness of the material that is applied first—sacrificial material or structure material—is deposited between [10 µm; 50 µm], in one embodiment between [20 µm; 30 µm]. This layer thickness defines the maximum possible thickness of each of the multitude of layers. In a method sequence according to one embodiment, where step I is the first one carried out, it has turned out to be advantageous in one embodiment if the sacrificial material is deposited with a layer thickness between [10 µm; 50 µm], in one embodiment between [20 µm; 30 µm]. The layer thickness of the sacrificial material also defines the layer thickness of the structure material. The layer thicknesses mentioned also allow producing microscopic three-dimensional structures which can, in one embodiment, be used in medical engineering.

The systems used in medical engineering, for example, electrodes, often include a multitude of individual parts. Due to the geometrical sizes, it is often very difficult to separately manufacture these individual parts and connect them to each other thereafter. To overcome this drawback, a multi-layer method that is described herein can be used to produce a three-dimensional structure by successively producing a plurality of layers from a sacrificial material and a structure material.

Biocompatible metals that are used in medicine can be deposited by electrochemical processes only with comparably small layer thicknesses within the 1-μm range. As a consequence, it is provided according to one embodiment that the structure material is applied by means of physical gas separation. In known sacrificial materials, however, this is to disadvantage in that parts of the sacrificial material diffuse into the structure material. Since, in general, the sacrificial material is not a biocompatible material, this reduces the possibility of using three-dimensional structures that have been produced in this manner for medically implantable devices. This drawback is the starting basis for one embodiment.

Figure 1:
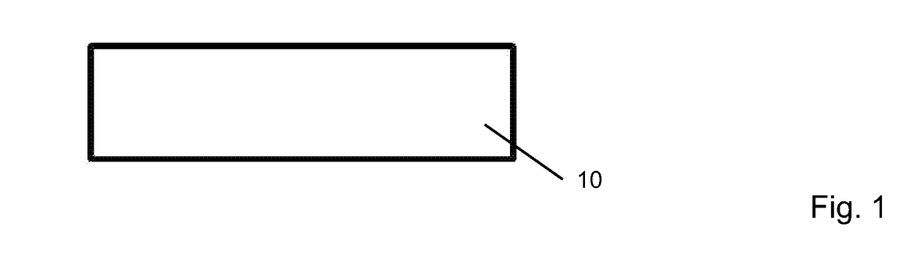
FIG. 1 illustrates a substrate.
Figure 2:
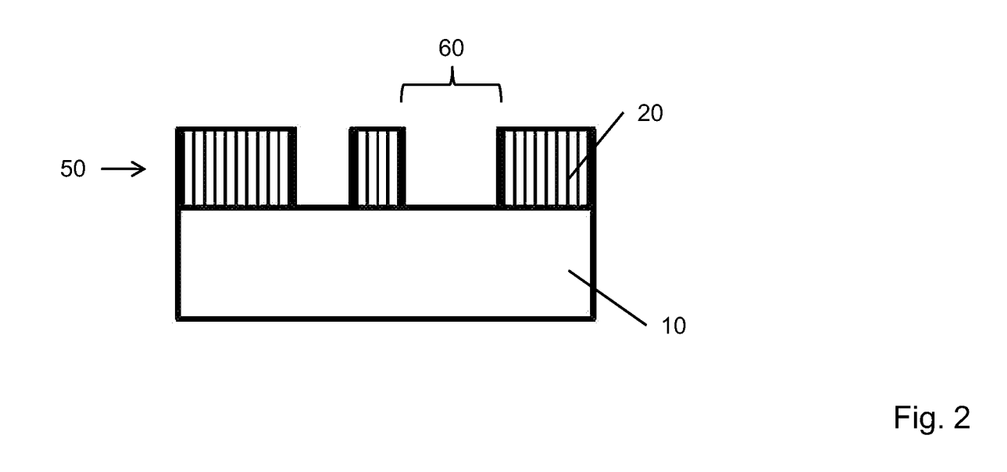
FIG. 2 illustrates a sacrificial material applied onto the substrate.

The starting basis for the production of the three-dimensional structure to be achieved is a substrate 10, such as it is illustrated in FIG. 1. In general, this substrate 10 is electrically conductive and can, for example, be a metal. In a first step I, a sacrificial material is deposited onto the substrate 10 at least in parts by means of an electrochemical process. This can, for example, be done within the scope of a galvanic process. As is illustrated in FIG. 2, the produced layer 50 does not fully cover the substrate 10 with the sacrificial material 20. Rather, the sacrificial material 20 forms some type of mask on the substrate 10 which leaves open spaces 60 which are not covered with the sacrificial material 20. Such a production of a mask from sacrificial material 20 can be achieved by previously applying photoresists onto and etching said photoresists off from the substrate 10. The sacrificial material 20 can then be applied into the resulting negative mask. In order to prevent parts of the sacrificial material 20 from diffusing into the structure material 30 which is still to be described, it is provided according to one embodiment that the sacrificial material 20 is at least one of the group consisting of nickel, silver, palladium, and gold. It is expressly pointed out that the order of steps I and II illustrated herein can be exchanged. The method according to one embodiment also includes a sequence where the structure material (step II) is applied first and the sacrificial material (step I) is applied thereafter.

Figure 3:
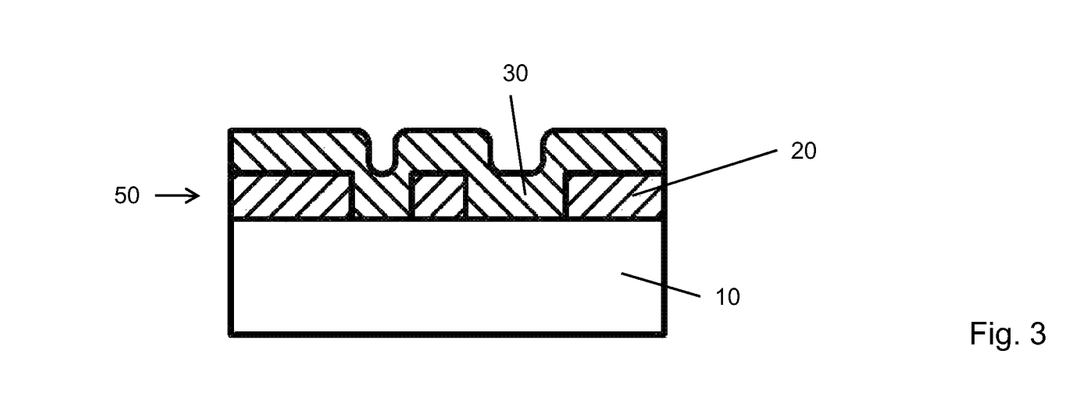
FIG. 3 illustrates a layer of a structure material applied onto the sacrificial material.

FIG. 3 illustrates the direct application of the structure material by means of physical gas phase deposition within the scope of step II, wherein the structure material is a metal. For example, the structure material can be platinum, platinum-iridium, tantalum or tantalum-niobium-tungsten. As can be seen, the structure material 30 is applied directly onto the sacrificial material 20. However, in order to prevent parts of the sacrificial material 20 from diffusing into the structure material 30, it is provided according to one embodiment that the sacrificial material includes at least elements of one of the metals of the group consisting of nickel, silver, palladium, and gold. In an alternative variant, the sacrificial material can also consist of at least one of the group consisting of nickel, silver, palladium, and gold. Within the scope of one embodiment, diffusion means penetration of parts of the sacrificial material into the structure material down to a depth of more than 200 nm, in one embodiment preferably more than 100 nm. Although the aforementioned sacrificial materials 20 may penetrate into superficial layers of the structure material of less than 100 nm, in one embodiment more preferably less than 50 nm, in one embodiment most preferably less than 25 nm, the sacrificial material 20 will not flow into the structure material 30 down to depths in excess thereof. It was possible to furnish appropriate proof that, when the structure material 30 is deposited by means of a physical gas phase deposition process, sacrificial material 20 does not penetrate into the surface according to the aforementioned dimensions of the structure material.

Figure 4:
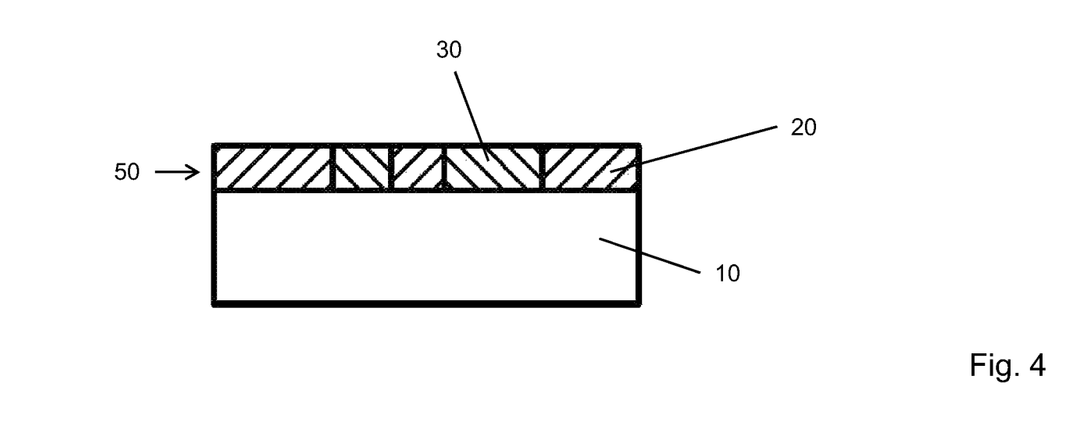
FIG. 4 illustrates an individual layer which includes both a sacrificial material and a structure material.

Applying the structure material 30, as illustrated in FIG. 3, is followed by a processing step in which protruding residues of the structure material 30 and/or the sacrificial material 20 are, in one embodiment, removed mechanically. This results in an individual layer 50 which is illustrated in FIG. 4 by way of example.

Figure 5:
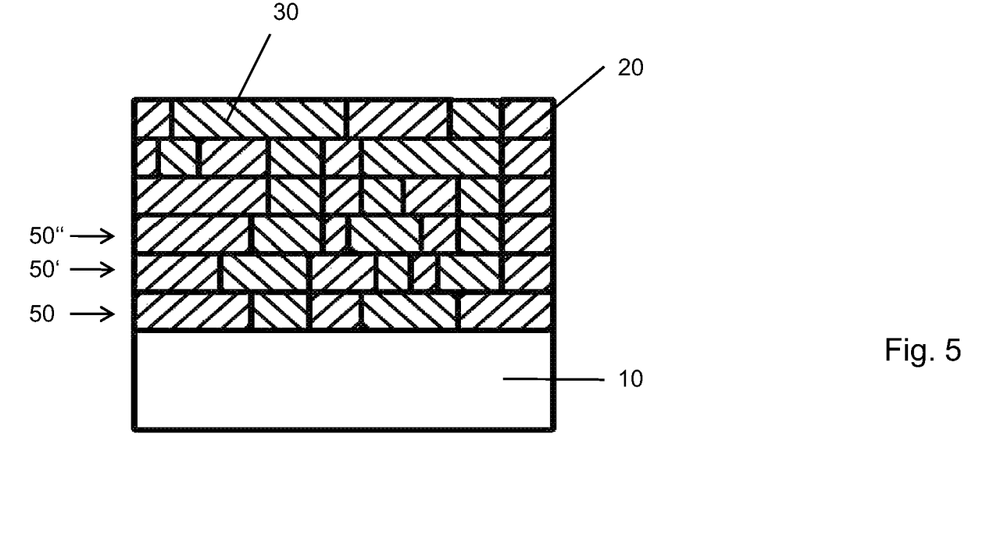
FIG. 5 illustrates a multitude of successive layers.

FIG. 5 now illustrates a multitude of successive layers 50, 50', 50" wherein, with the exception of the first layer 50, each of the successive layers is arranged on the preceding layer 50', 50". Each of the successive layers 50, 50', 50" includes at least two materials. Therein, one material is a sacrificial material 20, another material is a structure material 30.

The special feature is that parts of the sacrificial material 20 do not diffuse into the structure material 30. This results in a structure material 30 which does not include any contamination whatsoever with parts of the sacrificial material 20.

Figure 6:
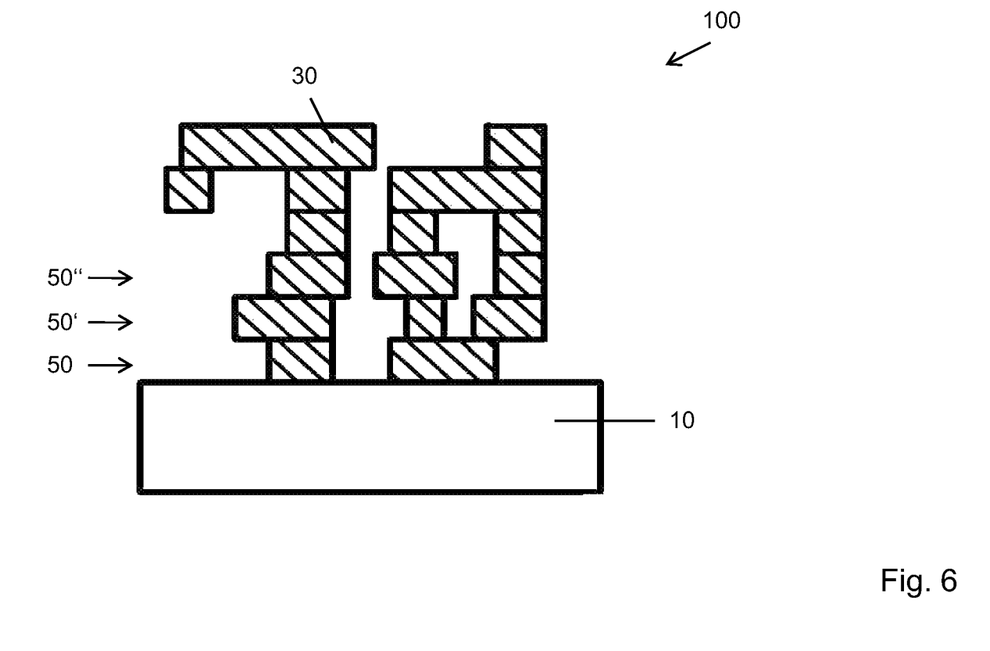
FIG. 6 illustrates a three-dimensional structure produced from the layers.
Figure 7:
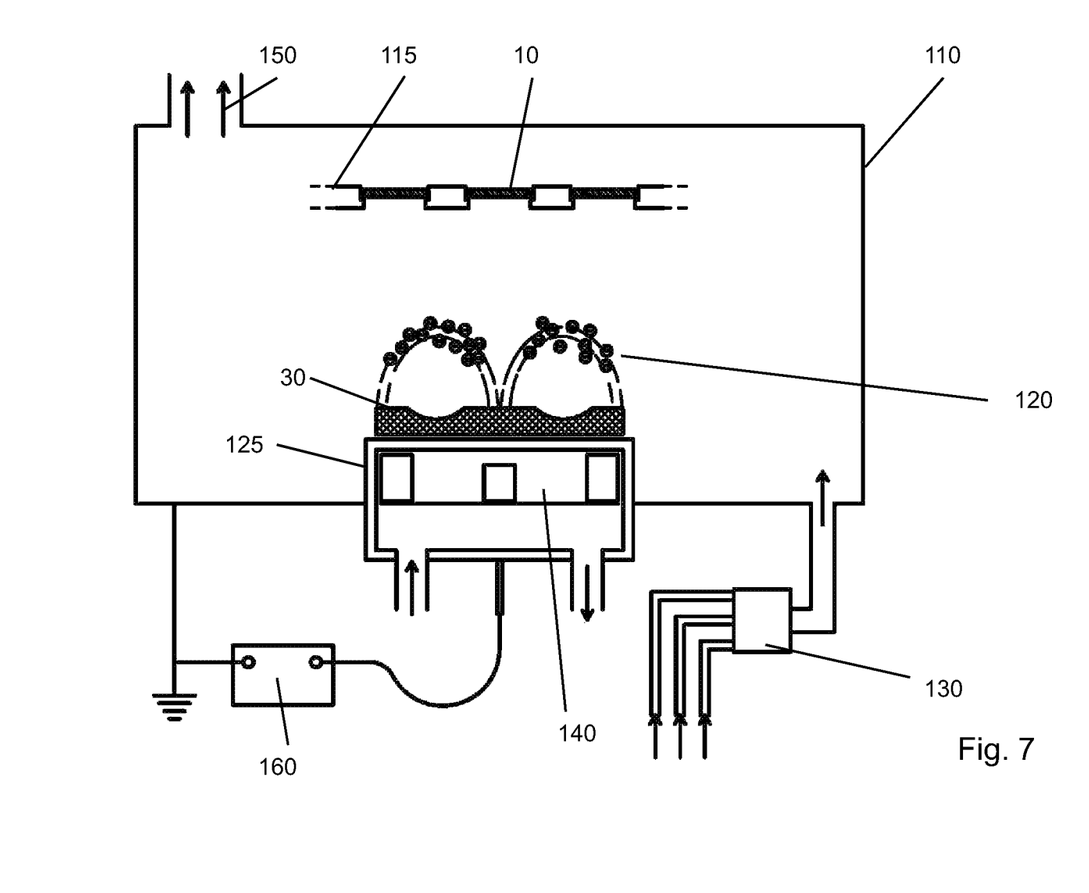
FIG. 7 is a schematic diagram of a physical gas phase deposition process.

Within the scope of step (B), a three-dimensional structure is uncovered after a multitude of successive layers 50, 50', 50" has been produced. This is illustrated in FIG. 6. Uncovering within the scope of step (B) is achieved by removing at least a part, in one embodiment the complete part, of the sacrificial material 20. The only material remaining is the structure material. As is illustrated in FIG. 7, each of the successive layers 50, 50', 50" forms a plane of a cross-section through the three-dimensional structure 100. By cleverly selecting the arrangement of the sacrificial material, it is now possible to build up three-dimensional structures 100 which consist of a multitude of parts that can even be moved in relation to each other. It is, therefore, no longer necessary to assemble the individual parts. What is more, layer thicknesses of the individual layers 50, 50', 50" ranging from 10 μm to 30 μm ensure that it is even possible to produce fine structures.

FIG. 7 illustrates a chamber of a magnetron sputtering system, which is in one embodiment, used for physical gas phase deposition. This magnetron sputtering system includes a vacuum chamber 110 in which the substrate 10 is arranged in a substrate holder 115. A process gas—here: argon, oxygen and/or nitrogen—is supplied to the vacuum chamber 110 via a gas supply system 130. Appropriate devices, such as a turbomolecular pump, ensure that the process gases that are introduced into the vacuum chamber 110 are sucked off 150. The material which is to be deposited onto the substrate rests on a heat sink 125. As illustrated in the figure, the material to be sputtered here is the structure material 30. A ring magnet 140 is arranged below the structure material 30 inside the heat sink 125. Depending on the system used, an acceleration voltage or a high-frequency voltage can be applied to the ring magnet 140. A zone of increased electron density which causes ionization of the process gas forms above the structure material 30. The electrons thus produced then bombard the sputter material and knock it out. By appropriately charging the substrate 10 electrically, the ions condensate on the substrate 10 to be bombarded and form the layer of the structure material 30 there. In a trial, a platinum target was operated with a power level of 8 W/cm$^2$ (area of 44.2 cm$^2$, power=368 W). This resulted in a deposition rate of approx. 0.2 μm/min which was used to produce Pt layers with a layer thickness of up to 30 µm. The pressure in the vacuum chamber was within a range from 1×10E-3 to 1×10E-2 mbar.

It has turned out to be advantageous in one embodiment if, within the scope of the physical gas phase deposition, not only one but at least two metals are deposited onto the substrate 10 at the same time. According to one embodiment, the two metals interconnect as structure material 30 to form an alloy. For example, the deposited structure material 30 can, therefore, be a platinum-iridium alloy. Such alloys are, in one embodiment to be preferred within the scope of medical engineering. In order to achieve a composition of the alloy to be deposited that is as uniform as possible and/or a uniform layer thickness of the structure material 30 in each of the successive layers 50, 50', 50", it has also turned out to be advantageous in one embodiment if the substrate 10 and/or the layers 50, 50', 50" that are already placed on top of each other are moved within the scope of the physical gas phase deposition—step II—and/or the electrochemical process—step I. This is to be interpreted such that, for example, the substrate holder 150 is moved above the target region in the vacuum chamber 110 in a rotary manner or in the plane of the substrate.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for the production of a three-dimensional structure of successive layers, comprising:
   (A) producing a multitude of successive layers wherein, with the exception of a first layer, each of the successive layers is arranged on a preceding layer, wherein
      each of the successive layers comprises at least two materials wherein one material is a sacrificial material and one material is a structure material,
      each of the successive layers defines a successive cross-section through the three-dimensional structure,
   producing each of the layers comprises the following steps:
   I. depositing the sacrificial material by means of an electrochemical process,
   II. depositing the structure material by means of physical gas phase deposition, wherein the structure material is a metal,
   (B) after a multitude of successive layers has been produced, uncovering the three-dimensional structure by removing at least a part of the sacrificial material,
   characterized in that
   the sacrificial material is at least one of the group consisting of nickel, silver, palladium, and gold, and that the sacrificial material is selected such that it does not diffuse into the structure material when the structure material is deposited by the physical gas phase deposition.

2. The method according to claim 1, characterized in that the structure material comprises a noble and/or platinum and/or refractory metal.

3. The method according to claim 1, characterized in that the structure material comprises at least one of the following metals: platinum, platinum-iridium, tantalum, tantalum-tungsten, tantalum-niobium-tungsten, nickel, nickel-tantalum, nickel-tungsten, niobium and niobium-zirconium.

4. The method according to claim 3, characterized in that the structure material comprises at least 50% by weight of one of the following metals: platinum, platinum-iridium, tantalum, tantalum-tungsten, tantalum-niobium-tungsten, nickel, nickel-tantalum, nickel-tungsten, niobium and niobium-zirconium.

5. The method according to claim 4, characterized in that the successive layers are moved within the scope of depositing in steps I and/or II, in order to achieve a homogeneous composition of the structure material.

6. The method according to claim 1, characterized in that, by means of physical gas phase deposition, at least two metals are deposited at the same time, wherein the two metals form an alloy as structure material.

7. The method according to claim 1, characterized in that, during the physical gas phase deposition, use is made of gas flow sputtering and/or magnetron sputtering.

8. The method according to claim 1, characterized in that the sacrificial material is deposited with a layer thickness between 10 µm and 50 µm.

9. The method according to claim 1, characterized in that the sacrificial material is deposited with a layer thickness between 20 µm and 30 µm.

10. The method according to claim 1, characterized in that the structure material comprises platinum and the sacrificial material comprises silver such that the metal completely prevents the sacrificial material from penetrating to the structure material during the physical gas phase deposition.

11. A method for the production of a three-dimensional structure of successive layers, comprising:
    producing a multitude of successive layers;
    wherein, with the exception of a first layer, each of the successive layers is arranged on a preceding layer;
    wherein each of the successive layers comprises a sacrificial material and a structure material;
    wherein each of the successive layers defines a successive cross-section through the three-dimensional structure;
    wherein producing each of the layers comprises depositing the sacrificial material by means of an electrochemical process and depositing the structure material by means of physical gas phase deposition;
    wherein the structure material is a metal; and
    after a multitude of successive layers has been produced, uncovering the three-dimensional structure by removing at least a part of the sacrificial material;
    wherein the sacrificial material is selected from a group consisting of nickel, silver, palladium, and gold and that the sacrificial material is selected such that it does not diffuse into the structure material when the structure material is deposited by the physical gas phase deposition.

12. The method according to claim 11, characterized in that the structure material comprises a noble and/or platinum and/or refractory metal.

13. The method according to claim 11, characterized in that the structure material comprises at least one of the following metals: platinum, platinum-iridium, tantalum, tantalum-tungsten, tantalum-niobium-tungsten, nickel, nickel-tantalum, nickel-tungsten, niobium and niobium-zirconium.

14. The method according to claim 11, wherein at least two metals are deposited at the same time by means of physical gas phase deposition, and wherein the two metals form an alloy as structure material.

15. The method according to claim 11, wherein use is made of gas flow sputtering and/or magnetron sputtering during the physical gas phase deposition.

16. The method according to claim 11, wherein the sacrificial material is deposited with a layer thickness between 10 μm and 50 μm.

17. The method according to claim 11, characterized in that each successive layer is moved in at least one of the three physical planes during the physical gas phase deposition of the structure material while the two metals are deposited at the same time such that the successive layers thus formed include a uniform and homogeneous composition.

* * * * *